United States Patent
Khojasteh et al.

(10) Patent No.: US 6,927,015 B2
(45) Date of Patent: Aug. 9, 2005

(54) UNDERLAYER COMPOSITIONS FOR MULTILAYER LITHOGRAPHIC PROCESSES

(75) Inventors: Mahmoud M. Khojasteh, Poughkeepsie, NY (US); Timothy M. Hughes, Marlboro, NY (US); Ranee W. Kwong, Wappingers Falls, NY (US); Pushkara Rao Varanasi, Poughkeepsie, NY (US); William R. Brunsvold, Poughkeepsie, NY (US); Margaret C. Lawson, LaGrangeville, NY (US); Robert D. Allen, San Jose, CA (US); David R. Medeiros, Ossining, NY (US); Ratnam Sooriyakumaran, San Jose, CA (US); Phillip Brock, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/920,762

(22) Filed: Aug. 18, 2004

(65) Prior Publication Data

US 2005/0019704 A1 Jan. 27, 2005

Related U.S. Application Data

(62) Division of application No. 10/026,184, filed on Dec. 21, 2001, now Pat. No. 6,818,381.

(51) Int. Cl.$^7$ .............................. G03F 7/40; G03F 7/11
(52) U.S. Cl. .................. 430/317; 430/313; 430/318; 430/323

(58) Field of Search .................. 430/313, 318, 430/317, 323

(56) References Cited

U.S. PATENT DOCUMENTS

| | | | | |
|---|---|---|---|---|
| 4,978,594 A | * | 12/1990 | Bruce et al. | 430/323 |
| 5,057,399 A | * | 10/1991 | Flaim et al. | 430/313 |
| 5,312,716 A | * | 5/1994 | Unoki et al. | 430/313 |
| 5,677,112 A | * | 10/1997 | Urano et al. | 430/325 |
| 5,985,524 A | | 11/1999 | Allen et al. | 430/326 |
| 6,054,248 A | | 4/2000 | Foster et al. | 430/270.1 |
| 6,146,793 A | | 11/2000 | Schaedeli et al. | 430/270.1 |
| 6,156,479 A | | 12/2000 | Meador et al. | 430/270.1 |
| 6,165,682 A | | 12/2000 | Foster et al. | 430/270.1 |
| 6,187,505 B1 | | 2/2001 | Lin et al. | 430/270.1 |
| 6,261,743 B1 | | 7/2001 | Pavelcheck et al. | 430/325 |
| 6,309,790 B1 | | 10/2001 | Jung et al. | 430/270.1 |
| 6,495,305 B1 | * | 12/2002 | Enomoto et al. | 430/270.1 |
| 2002/0028409 A1 | * | 3/2002 | Yasunami et al. | 430/272.1 |

* cited by examiner

Primary Examiner—Cynthia Hamilton
(74) Attorney, Agent, or Firm—Steven Capella

(57) ABSTRACT

Compositions suitable for forming planarizing underlayers for multilayer lithographic processes are characterized by the presence of (A) a polymer containing: (i) cyclic ether moieties, (ii) saturated polycyclic moieties, and (iii) aromatic moieties for compositions not requiring a separate crosslinker, or (B) a polymer containing: (i) saturated polycyclic moieties, and (ii) aromatic moieties for compositions requiring a separate crosslinker. The compositions provide outstanding optical, mechanical and etch selectivity properties. The compositions are especially useful in lithographic processes using radiation less than 200 nm in wavelength to configure underlying material layers.

5 Claims, No Drawings

UNDERLAYER COMPOSITIONS FOR MULTILAYER LITHOGRAPHIC PROCESSES

CROSS REFERENCE TO RELATED APPLICATIONS

This application is a continuation-in-part of U.S. patent application Ser. No. 09/514,212, filed Feb. 28, 2000, the disclosure of which is incorporated herein by reference.

This application is a divisional of U.S. patent application Ser. No. 10/026,184 filed on Dec. 21, 2001 now U.S. Pat. No. 6,818,381, the disclosure of which is incorporated herein by reference.

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed.

The resolution capability of lithographic processes is generally a function of the wavelength of imaging radiation, the quality of the optics in the exposure tool and the thickness of the imaging layer. As the thickness of the imaging resist layer increases, the resolution capability decreases. Thinning of a conventional single layer resist to improve resolution generally results in compromise of the etch resistance of the resist which is needed to transfer the desired image to the underlying material layer. In order to obtain the resolution enhancement benefit of thinner imaging layers, multilayer lithographic processes (e.g., so-called bilayer process) have been developed. In multilayer lithographic processes, a so-called planarizing underlayer layer is used intermediate between the imaging resist layer (typically a silicon-containing resist) and the underlying material layer to be patterned by transfer from the patterned resist. The underlayer layer receives the pattern from the patterned resist layer, and then the patterned underlayer acts as a mask for the etching processes needed to transfer the pattern to the underlying material.

While planarizing underlayer materials exist in the art, there is a continued desire for improved compositions especially compositions useful in lithographic processes using imaging radiation less than 200 nm (e.g., 193 nm) in wavelength. Known underlayers for I-line and 248 nm DUV multilayer lithographic applications are typically based on Novolac or polyhydroxystyrene polymers. These materials very strongly absorb 193 nm radiation, thus are not suitable for 193 nm lithographic applications.

The planarizing underlayer compositions should be sufficiently etchable selective to the overlying photoresist (to yield a good profile in the etched underlayer) while being resistant to the etch process needed to pattern the underlying material layer. Additionally, the planarizing underlayer composition should have the desired optical characteristics (e.g., refractive index, optical density, etc.) such that the need for any additional antireflective layer is avoided. The planarizing underlayer composition should also have physical/chemical compatibility with the imaging resist layer to avoid unwanted interactions which may cause footing and/or scumming.

It is also desired to reduce the number of separate ingredients in the planarizing underlayer composition in order to enhance the economic viability of multilayer lithographic processes.

SUMMARY OF THE INVENTION

The invention encompasses novel planarizing underlayer precursor compositions which are useful in multilayer lithographic processes. These underlayer precursor compositions provide underlayers having outstanding optical, mechanical and etch selectivity properties. The invention also encompasses lithographic structures containing the underlayers prepared from the compositions of the invention, methods of making such lithographic structures, and methods of using such lithographic structures to pattern underlying material layers on a substrate.

In one aspect, the invention encompasses an underlayer precursor composition suitable for formation of a planarizing underlayer, the composition comprising:
  (a) a polymer containing:
    (i) cyclic ether moieties,
    (ii) saturated polycyclic moieties, and
    (iii) aromatic moieties, and
  (b) an acid generator.

The acid generator is preferably a thermally activated acid generator. Where the underlayer is to be used with 157 nm lithographic process, the polymer preferably further includes fluorine moieties.

In an alternative embodiment, the invention encompasses an underlayer precursor composition suitable for formation of a planarizing underlayer, the composition comprising:
  (a) a polymer containing:
    (i) saturated polycyclic moieties, and
    (ii) aromatic moieties,
  (b) an acid generator, and
  (c) a crosslinker.

In another aspect, the invention encompasses a lithographic structure on a substrate, the structure comprising:
  (a) a planarizing layer obtained by reacting an underlayer precursor composition of the invention,
  (b) a radiation-sensitive imaging layer over the planarizing layer.

In another aspect, the invention encompasses method of forming a patterned material feature on a substrate, the method comprising:
  (a) providing a material layer on a substrate,
  (b) forming a planarizing layer over the material layer, the planarizing layer being formed by reacting an underlayer precursor composition of the invention,
  (c) forming a radiation-sensitive imaging layer over the planarizing layer,
  (d) patternwise exposing the imaging layer to radiation thereby creating a pattern of radiation-exposed regions in the imaging layer, (e) selectively removing portions of the imaging layer and the planarizing layer to expose portions of the material layer, and (f) etching the exposed portions of the material layer, thereby forming the patterned material feature.

The material to be patterned is preferably a conductive, semiconductive, magnetic or insulative material.

The invention also encompasses methods of making lithographic structures.

These and other aspects of the invention are discussed in further detail below.

DETAILED DESCRIPTION OF THE INVENTION

The invention encompasses novel planarizing underlayer precursor compositions which are useful in multilayer lithographic processes. The invention also encompasses lithographic structures containing the underlayers obtained from the precursor compositions of the invention, methods of making such lithographic structures and methods of using such lithographic structures to pattern underlying material layers on a substrate.

In a first embodiment, the planarizing underlayer precursor compositions of the invention generally comprise:

(a) a polymer containing:
  (i) cyclic ether moieties,
  (ii) saturated polycyclic moieties, and
  (iii) aromatic moieties, and
(b) an acid generator.

The cyclic ether moieties are preferably present in groups pending from monomers making up at least a portion of the backbone of the polymer. Preferably, the cyclic ether moieties are pendant from acrylate monomers (e.g., an acrylate or methacrylate) as part of an ester group. If desired, other components may be present in the ester group (e.g., a saturated polycyclic moiety such as shown below). Examples of cyclic ether moieties are trioxane, tetrahydrofuran, oxetane, oxepane, trithiane, tetrathiane, and epoxy moieites. The cyclic ether moiety is preferably an epoxy moiety, more preferably a glycidyl moiety.

The saturated polycyclic moieties may be present in groups pending from monomers making up at least a portion of the backbone of the polymer or may themselves be present as part of the polymer backbone (e.g., in the case where a cyclic olefin monomer is used in the polymer). The saturated polycyclic moieties are preferably pendant from acrylate monomers (e.g., an acrylate or methacrylate) as part of an ester group. The saturated polycyclic moieties preferably contain at least 7 carbon atoms, more preferably about 10 to 20 carbon atoms. Examples of such moieties are norbornyl, isonorbornyl, adamantyl, etc.

The aromatic moieties are preferably present in groups pending from monomers making up at least a portion of the backbone of the polymer. The aromatic moieties may be non-fused aromatic rings (e.g., benzyl, phenyl or phenol groups) or fused aromatics such as anthracene. Generally, non-fused aromatic rings are preferred aromatic moieties. The aromatic moieties are preferably pendant from an ethylenic monomer (e.g., where styrene or hydroxystyrene are used in the polymer).

The relative mole ratio of moieties (i)–(iii) in the polymer is preferably selected to achieve the desired combination of optical and etch properties in the resulting underlayer. Preferably, the polymer contains about 10–50 mole % of (i) cyclic ether moieties, about 20–60 mole % of (ii) saturated polycyclic moieties, and about 20–60 mole % of (iii) aromatic moieties where the mole % are based on the total moles of moieties (i)–(iii) in the polymer.

Some examples of suitable polymers for the first embodiment are shown below:

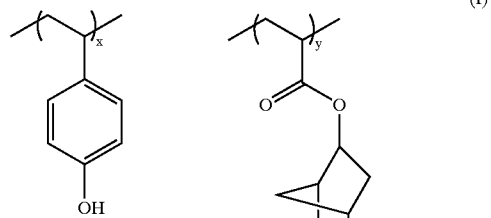

(I)

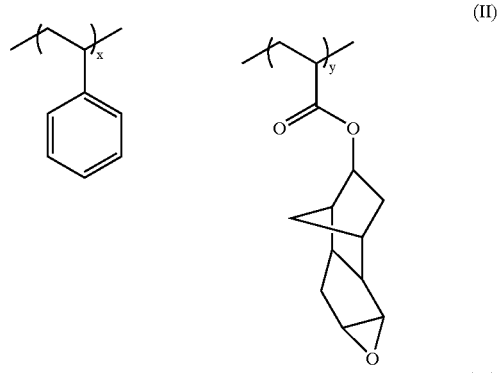

(II)

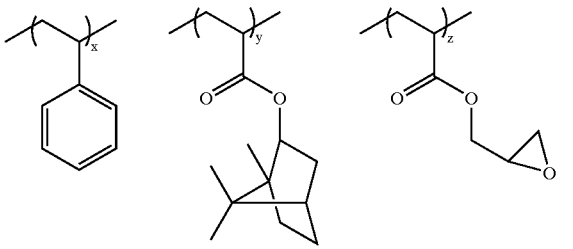

(III)

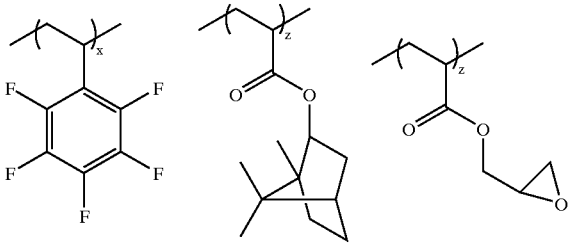

(IV)

where x, y, and z represent the relative quantities of each monomer. Generally, terpolymers such as shown in structures III and IV are the preferred polymers for use in the invention.

In an alternative embodiment, the underlayer precursor composition may comprise:

(a) a polymer containing:
  (i) saturated polycyclic moieties, and
  (ii) aromatic moieties,
(b) an acid generator, and
(c) a crosslinker.

The relative mole ratio of moieties (i)–(ii) in the polymer is preferably selected to achieve the desired combination of optical and etch properties in the resulting underlayer. Preferably, the polymer contains about 40–70 mole % of (i) saturated polycyclic moieties, and about 30–60 mole % of (ii) aromatic moieties where the mole % are based on the total moles of moieties (i)–(ii) in the polymer. The polymers of the alternative embodiment preferably contain hydroxyl functionality to a sufficient extent to promote reaction with the crosslinker.

Some examples of suitable polymers for the alternative embodiment are shown below:

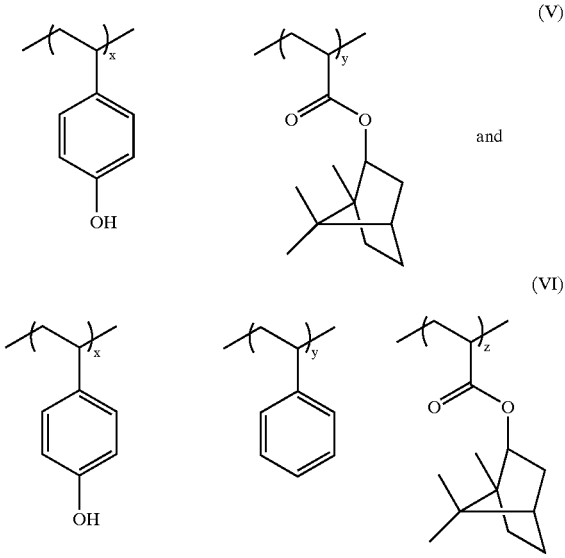

where x, y, and z represent the relative quantities of each monomer.

The compositions of the invention preferably produce underlayers having an extinction coefficient (k) of about 0.2–0.8, more preferably about 0.3–0.5 and a refractive index (n) of about 1.6–2.0, more preferably about 1.65–1.8. For cyclic olefin or acrylate-based imaging layers, a k value of 0.6 to 0.8 reduces standing waves for contact or trench applications.

If the underlayer is to be used in a multilayer lithographic process using 157 nm imaging radiation, the polymer preferably contains a fluorine component. The fluorine may be present as a pentafluoroaryl group (e.g., as perfluorostyrene), a trifluoromethyl group (e.g., as a trifluoromethyacrylate) or in another form compatible with the other constituents of the planarizing layer composition and with the synthesis techniques used to form the polymer.

The underlayer compositions of the invention are preferably substantially free of silicon, especially where the imaging layer is a silicon-containing resist.

The polymers of the invention preferably have a weight average molecular weight, before any crosslinking reaction, of at least about 1000, more preferably a weight average molecular weight of about 5000–50000.

The acid generator is preferably an acid generator compound that liberates acid upon thermal treatment. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference.

If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the planarizing underlayer composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line).

If desired in the first embodiment and definitely in the alternative embodiment, the compositions of the invention may contain a separate crosslinking component that can be reacted with the underlayer polymer in a manner which is catalyzed by generated acid and/or by heating. Generally, the crosslinking component used in the underlayer compositions of the invention may be any suitable crosslinking agent known in the negative photoresist art which is otherwise compatible with the other selected components of the composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylpropyltetramethoxymethyl glycoluril, available under the POWDERLINK trademark from American Cyanamid Company. Other possible crosslinking agents include: 2,6-bis(hydroxymethyl)-p-cresol, compounds having the following structures:

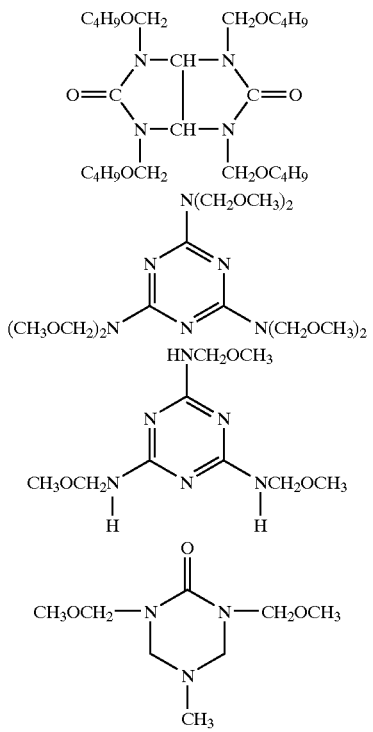

-continued

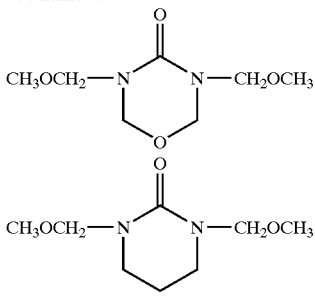

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other crosslinking agents such as bis-epoxies or bis-phenols (e.g., bisphenol-A) may also be used. Combinations of crosslinking agents may be used.

The planarizing underlayer compositions of the invention preferably contain (on a solids basis) (i) about 50–98 wt. % of the polymer, more preferably about 70–80 wt. %, (ii) about 0–50 wt. % of crosslinking component, for the alternative embodiment: preferably about 3–25%, more preferably about 5–25 wt. %, and (iii) about 1–20 wt. % acid generator, more preferably about 1–15 wt. %.

The planarizing underlayer compositions of the invention may be used in combination with any desired resist material in the forming of a lithographic structure. Preferably, the resist is imageable with ultraviolet radiation (e.g. <400 nm wavelength) or with electron beam radiation. Examples of suitable resist materials are described in U.S. Pat. Nos. 5,861,231; 5,962,184; and 6,037,097, the disclosures of which are incorporated herein by reference. A preferred resists for bilayer applications using 193 nm radiation are disclosed in U.S. patent application Ser. No. 09/514,212, filed Feb. 28, 2000, the disclosure of which is incorporated herein by reference.

The planarizing underlayer compositions of the invention will typically contain a solvent prior to their application to the desired substrate. The solvent may be any solvent conventionally used with resists which otherwise does not have any excessively adverse impact on the performance of the underlayer composition. Preferred solvents are propylene glycol monomethyl ether acetate or cyclohexanone. The amount of solvent in the composition for application to a substrate is preferably sufficient to achieve a solids content of about 8–20 wt. %. Higher solids content formulations will generally yield thicker coating layers. The compositions of the invention may further contain minor amounts of auxiliary components (e.g., surfactants, dyes, etc.) as may be known in the art.

The planarizing underlayer compositions of the invention can be prepared by combining the polymer, acid generator, and any other desired ingredients using conventional methods. The compositions of the invention advantageously may be formed into planarizing underlayers on a substrate by spin-coating followed by baking to achieve crosslinking and solvent removal. The baking is preferably conducted at about 250° C. or less, more preferably about 170°–230° C. The baking time may be varied depending on the layer thickness and bake temperature. A typical time at 215° C. would be about two minutes.

The thickness of the planarizing underlayer composition of the invention may be varied depending on the underlying topography and the intended etch protocol (for etching the material layer to be patterned). The thickness is preferably about 0.3–5.0 μm.

The compositions of the invention are especially useful for lithographic processes used in the manufacture of integrated circuits on semiconductor substrates. The compositions are especially useful for lithographic processes using 193 nm or shorter wavelength UV imaging radiation.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the invention is preferably applied directly over the material layer to be patterned, preferably by spin-coating. The composition is then baked to remove solvent and cure (crosslink) the composition. A radiation-sensitive resist layer can then be applied (directly or indirectly) over the cured planarizing underlayer composition of the invention. The resist is preferably a silicon-containing resist imageable with the desired wavelength of radiation.

Typically, the solvent-containing resist composition is applied using spin coating or other technique. The substrate with the resist coating is then preferably heated (pre-exposure baked) to remove the solvent and improve the coherence of the resist layer. The thickness of the applied layer is preferably as thin as possible provided that the thickness is preferably substantially uniform and that the resist layer be sufficient to withstand subsequent processing (typically reactive ion etching) to transfer the lithographic pattern to the planarizing underlayer. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 millijoules/cm$^2$).

After the desired patternwise exposure, the resist layer is typically baked to further complete the acid-catalyzed reaction and to enhance the contrast of the exposed pattern. The post-exposure bake is preferably conducted at about 60–175° C., more preferably about 90–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the planarizing underlayer of the invention by reactive ion etching or other suitable etch techniques known in the art.

After the opening of the planarizing underlayer of the invention, the underlying material layer to be patterned may then be etched using an etchant appropriate to the material layer composition. Once the desired pattern transfer has taken place, any remaining underlayer and resist may be removed using conventional stripping techniques.

Thus, the compositions of the invention and resulting lithographic structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

Examples of lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

Synthesis of Structure III Polymer

Styrene 78.03 g, 0.74 mole), glycidylmethacrylate (159.82 g, 1.12 mole), isobornylmethacrylate (138.75 g, 0.62 mole), azobisisobutyronitrile (AIBN) catalyst (14.25 g, 3.5% of total moles of monomers) and 1128 g of tetrahydrofuran (THF) (25% wt-wt conc.) were combined in a three liter 3-neck round bottom flask equipped with condenser, thermometer, a nitrogen inlet and a magnetic stirrer bar. The reaction mixture was stirred at room temperature and bubbled with $N_2$ flow for 1 hour prior turning the heating mantle on. The reaction was conducted for 18 hours at 67–70° C. with a blanket $N_2$ flow. Then, the reaction solution was cooled to room temperature, diluted with equal volume of THF and added dropwise to stirring hexane (1:10). The slurry was stirred overnight before filtration. Solid was air dried for five hours and re-dissolved in THF (15% wt-wt) and reprecipitated in hexane (1:10). The solid was collected by filtration and air dried for five hours. Final drying was carried out in a vacuum oven at 60° C. overnight. The yield was 83%.

EXAMPLE 2

The above polymer was formulated into a planarizing underlayer composition by combining with 4.75 wt. % of an acid generator di-(t-butyl)iodonium perfluorobutane sulfonate (PFBuS) in PMA solvent. A solution was coated to 5000 Å and baked at 225° C. for 2 minutes prior to resist coating with a silicon-containing resist described in copending application Ser. No. 09/514,212. Profiles with no foot or scum were achieved at 125 nm equal lines and spaces using a 0.60 NA 193nm stepper.

What is claimed is:

1. A method of forming a patterned material feature on a substrate, said method comprising:

(a) providing a material layer on a substrate, (b) forming a planarizing layer over said material layer, said planarizing layer being formed by reacting a planarizing underlayer composition, said underlayer composition comprising
   a polymer containing:
   (i) poxy moieties,
   (ii) saturated polycyclic hydrocarbon moieties,
   (iii) aromatic moieties, and
   (iv) fluorine-containing moieties, and
   an acid generator, (c) forming a radiation-sensitive imaging layer over said planarizing layer, (d) patternwise exposing said imaging layer to radiation thereby creating a pattern of radiation-exposed regions in said imaging layer, (e) selectively removing portions of said imaging layer and planarizing layer to expose portions of said material layer, and (f) etching said exposed portions of said material layer, thereby forming said patterned material feature.

2. The method of claim 1 further comprising:

(g) removing any remaining portions of said imaging layer and said planarizing layer from material layer.

3. The method of claim 1 wherein said radiation is ultraviolet radiation having a wavelength less than 200 nm.

4. The structure of claim 1 wherein said imaging layer is a silicon-containing resist.

5. The method of claim 1 wherein said material layer is selected from the group consisting of dielectric, metals, and semiconductors.

* * * * *